(12) United States Patent
Ohtsuka

(10) Patent No.: US 7,578,304 B2
(45) Date of Patent: Aug. 25, 2009

(54) CLEANING AND DRYING APPARATUS FOR SUBSTRATE HOLDER CHUCK AND METHOD THEREOF

(75) Inventor: Hiromi Ohtsuka, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 474 days.

(21) Appl. No.: 10/923,309

(22) Filed: Aug. 19, 2004

(65) Prior Publication Data
US 2005/0039779 A1 Feb. 24, 2005

(30) Foreign Application Priority Data
Aug. 19, 2003 (JP) ............................. 2003-294792
Jun. 17, 2004 (JP) ............................. 2004-180094

(51) Int. Cl.
*B08B 3/02* (2006.01)
(52) U.S. Cl. .................................................. 134/95.2
(58) Field of Classification Search ................. 134/95.2
See application file for complete search history.

(56) References Cited
U.S. PATENT DOCUMENTS

| | | | | |
|---|---|---|---|---|
| 4,619,845 A | * | 10/1986 | Ayers et al. ................. 427/422 |
| 4,957,783 A | * | 9/1990 | Gabryszewski ............. 427/424 |
| 5,226,437 A | * | 7/1993 | Kamikawa et al. ........ 134/104.1 |
| 5,253,663 A | * | 10/1993 | Tanaka et al. ................ 134/95.2 |
| 5,379,784 A | * | 1/1995 | Nishi et al. ................ 134/102.3 |
| 5,896,875 A | * | 4/1999 | Yoneda ..................... 134/102.3 |
| 2002/0130106 A1 | * | 9/2002 | Mertens et al. ................ 216/57 |

FOREIGN PATENT DOCUMENTS
JP  2000-012668  6/1998

\* cited by examiner

*Primary Examiner*—Frankie L Stinson
*Assistant Examiner*—Samuel A Waldbaum
(74) *Attorney, Agent, or Firm*—Morrison & Foerster LLP

(57) ABSTRACT

A cleaning and drying apparatus is provided for a substrate holder chuck equipped with a holding members 31 (32, 33) having a plurality of holding grooves 31*a* (32*a*, 33*a*) for holding a plurality of wafers W respectively. The apparatus includes a atomize nozzle 50 for spraying $N_2$-gas and deionized water to the holding grooves 31*a* of the holding member 31 of the chuck 30, a cleaning-liquid nozzle 60 for spraying deionized water to a side face 31*b* of the holding member 31 and an air cylinder 300 for causing relative movement between the atomize nozzle 50/the cleaning-liquid nozzle 60 and the holding member 31 of the chuck 30, along the longitudinal direction of the holding member 31 and horizontally. Due to driving of the air cylinder 300, the atomize nozzle 50 is constructed so as to spray $N_2$-gas and deionized water to the holding grooves 31*a* of the holding member 31 in advance of the cleaning-liquid nozzle 60. Accordingly, it is possible to shorten a cleaning-and-drying period for the substrate holder chuck and also possible to improve a throughput of the whole apparatus.

11 Claims, 11 Drawing Sheets

CLEANING AND DRYING APPARATUS FOR SUBSTRATE HOLDER CHUCK AND METHOD THEREOF

BACKGROUND OF THE INVENTION

1. Field of the Invention

This invention relates to a cleaning and drying apparatus for a substrate holder chuck and a cleaning and drying method for the substrate holder chuck.

2. Background Art

Generally, the conventional substrate holder chuck capable of transferring a plurality of substrates, such as semiconductor wafers, includes at least a lower holding member for holding the substrates and a plurality of side holding members for holding peripheral parts of the substrates on both sides of the lower holding member. Each of the above holding members is provided with a plurality of holding grooves in a row.

In the past, when cleaning and subsequently drying the above-constructed substrate holder chuck, a process of spraying a cleaning liquid to the holding members for the substrate holder chuck via cleaning-liquid nozzles and a process of ejecting dry gas to the holding members via dry-gas nozzles were repeatedly carried out for every holding members, i.e., one lower holding members and two side holding members, as shown in Japanese Patent Publication No. 2000-12668, claims, paragraph No.0049 and FIG. 7.

In the conventional cleaning and drying apparatus (method) of this kind, however, since the cleaning process and the drying process are carried out repeatedly and the cleaning-liquid nozzles and the dry-gas nozzles are separated from each other and since the operation of the cleaning-liquid nozzles depends on a supply pressure of the cleaning-liquid, it takes a lot of time to clean and dry the substrate holder chuck. Additionally, due to the consumption of much time for the cleaning and drying operations of the chuck, a throughput of the whole apparatus is reduced.

SUMMARY OF THE INVENTION

In the above-mentioned situation, it is an object of the present invention to provide a cleaning and drying apparatus for a substrate holder chuck and a cleaning and drying method thereof, by which it is possible to abbreviate a cleaning and drying time for the substrate holding chuck and also possible to improve a throughput of the cleaning and drying apparatus as a whole.

In order to accomplish the above object, the present invention provides a cleaning and drying apparatus for a substrate holder chuck including a holding member having a plurality of holding grooves formed in a row to hold a plurality of substrates, the cleaning and drying apparatus comprising: an atomize nozzle for spraying a cleaning liquid and gas to the holding grooves of the holding member; a cleaning-liquid nozzle for spraying a cleaning liquid to a side face of the holding member; and moving mechanism for relatively moving the atomize nozzle and the cleaning-liquid nozzle with respective to the holding member in a direction along the longitudinal direction of the holding member, wherein the atomize nozzle sprays the cleaning liquid and the gas to the holding grooves of the holding member in advance of the cleaning-liquid nozzle by operation of the moving mechanism.

Further, the present invention provides a cleaning and drying method for a substrate holder chuck including a holding member having a plurality of holding grooves formed in a row to hold a plurality of substrates, the cleaning and drying method of relatively moving a nozzle for spraying cleaning liquids with respect to the holding member in a direction along the longitudinal direction of the holding member to clean and dry the holding member, the cleaning and drying method comprising: a holding-groove cleaning process of allowing a atomize nozzle for spraying a cleaning liquid and a gas to spray the cleaning liquid and the gas into the holding grooves of the holding member; and a side-face cleaning process of allowing a cleaning-liquid nozzle for spraying a cleaning liquid to spray the cleaning liquid to side faces of the holding member.

Accordingly, since the cleaning-liquid nozzle sprays the cleaning liquid to the side faces of the holding member after spraying the cleaning liquid and the gas from the atomize nozzle into the holding grooves of the holding member of the substrate holder chuck, it is possible to clean the holding grooves with the cleaning liquid of high pressure, whereby chemical liquids flowing from the holding grooves to the side faces of the holding member and contaminants, such as particles, can be removed by the cleaning liquid sprayed from the cleaning-liquid nozzle to the side faces of the holding member. Thus, the cleaning operation for the holding member of the substrate holder chuck can be accomplished in a short time, effectively and certainly.

Additionally, the present invention provides a cleaning and drying apparatus for a substrate holder chuck including a holding member having a plurality of holding grooves formed in a row to hold a plurality of substrates, the cleaning and drying apparatus comprising: an atomize nozzle for spraying a cleaning liquid and gas to the holding grooves of the holding member; a switching equipment for switching from a supply of the cleaning liquid to a supply of the gas and vice versa, selectively; a dry-gas nozzle for spraying a dry gas to a side face of the holding member and the holding grooves thereof; a moving mechanism for relatively moving the atomize nozzle and the dry-gas nozzle with respective to the holding member in a direction along the longitudinal direction of the holding member; and a controller for controlling the switching operation of the switching equipment and the movement of the moving mechanism, wherein after the atomize nozzle sprays the cleaning liquid and the gas to the holding grooves of the holding member to execute cleaning, the atomize nozzle sprays only the gas to the holding grooves of the holding member by using the switching equipment, the dry-gas nozzle spraying the dry gas to the holding grooves and the side face of the holding member to execute drying by operation of the moving mechanism.

Thus, after spraying the cleaning liquid and the gas from the atomize nozzle into the holding grooves of the holding member, the atomize nozzle sprays the gas only to the holding grooves of the holding member and additionally, the dry-gas nozzle sprays the dry gas to the holding grooves and the side faces of the holding member to dry it. Consequently, it is possible to clean the holding grooves with the cleaning liquid of high pressure and also possible to complete the drying operation by the gas from the atomize nozzle and the dry gas from the dry-gas nozzle. Thus, the cleaning and drying operations can be accomplished in a short time, effectively and certainly. It is possible to improve the throughput of the whole apparatus.

The other feature of the invention resides in that the cleaning and drying apparatus further comprises a cleaning-liquid nozzle for spraying a cleaning liquid to the side faces of the holding member, the cleaning-liquid nozzle being movable by the moving mechanism, wherein, after the atomize nozzle sprays the cleaning liquid and the gas, after the cleaning-liquid nozzle sprays the cleaning liquid to the side face of holding member to execute cleaning, the atomize nozzle sprays only the gas to the holding grooves of the holding member by operating the switching equipment, the dry-gas nozzle spraying the dry gas to the holding grooves of the holding member and the side face thereof to execute drying by operation of the moving mechanism.

Further, the feature of the invention resides in that the cleaning and drying method for the substrate holder chuck further comprises: a holding-groove drying process of allowing the atomize nozzle to spray the gas into the holding grooves of the holding member; and a drying process of allowing a dry-gas nozzle for spraying a dry gas to spray the dry gas into the holding grooves of the holding member and side face thereof.

Accordingly, by spraying the cleaning liquid from the cleaning-liquid nozzle to the side faces of the holding member after spraying the cleaning liquid and the gas from the atomize nozzle into the holding grooves of the holding member of the substrate holder chuck, it is possible to clean the holding grooves with the cleaning liquid of high pressure and also possible to remove the chemical liquids flowing from the holding grooves to the side faces of the holding member and contaminants, such as particles, by the cleaning liquid sprayed from the cleaning-liquid nozzle to the side faces of the holding member. Additionally, at the drying operation, the atomize nozzle sprays the gas only into the holding grooves of the holding member while the dry-gas nozzle sprays the dry gas to the holding grooves and the side faces of the holding member. As a result, the cleaning and drying operations can be accomplished in a short time, effectively and certainly. Additionally, it is possible to improve the throughput of the whole apparatus.

One of features of the invention resides in that the cleaning and drying apparatus further comprises: a cleaning-liquid nozzle for spraying a cleaning liquid to the side faces of the holding member; and a secondary dry-gas nozzle for spraying the dry gas to the holding grooves, lower parts of the side faces and a base end of the holding member, wherein the cleaning-liquid nozzle and the secondary dry-gas nozzle are movable by the moving mechanism, after the atomize nozzle sprays the cleaning liquid and the gas to the holding grooves of the holding member, after the cleaning-liquid nozzle sprays the cleaning liquid to the side face of the holding member to execute cleaning, the atomize nozzle sprays the gas only to the holding grooves of the holding member by operating the switching equipment, the dry-gas nozzle to spray the dry gas to the holding grooves and the side faces of the holding member, the secondary dry-gas nozzle spraying the dry gas to the holding grooves and the lower parts of the side faces and the base end of the holding member to execute drying, by operation of the moving mechanism.

Further, according to the present invention, the cleaning and drying method for the substrate holder chuck further comprises: a holding-groove drying process of allowing the atomize nozzle to spray the gas into the holding grooves of the holding member; a primary drying process of allowing a primary dry-gas nozzle to spray the dry gas into the holding grooves of the holding member and side faces thereof; and a secondary drying process of allowing a secondary dry-gas nozzle to spray the dry gas to the holding grooves, lower parts of the side faces of the holding member and a base end thereof.

Accordingly, by spraying the cleaning liquid from the cleaning-liquid nozzle to the side faces of the holding member after spraying the cleaning liquid and the gas from the atomize nozzle into the holding grooves of the holding member of the substrate holder chuck, it is possible to clean the holding grooves with the cleaning liquid of high pressure and also possible to remove the chemical liquids flowing from the holding grooves to the side faces of the holding member and contaminants, such as particles, by the cleaning liquid sprayed from the cleaning-liquid nozzle to the side faces of the holding member. Additionally, at the drying operation, the atomize nozzle sprays the gas only into the holding grooves of the holding member. While, the dry-gas nozzle (the primary dry-gas nozzle) sprays the dry gas to the holding grooves and the side faces of the holding member and the secondary dry-gas nozzle sprays the dry gas to the holding grooves, the lower parts of the side faces and the base end of the holding member. As a result, the drying operation can be accomplished in a short time, effectively and certainly. Additionally, it is possible to improve the throughput of the whole apparatus.

Still further, the feature of the invention resides in that there are arranged, in order from a tip side of the holding member toward a base side thereof in a direction of an outward movement of the moving mechanism, the secondary dry-gas nozzle, the dry-gas nozzle, the atomize nozzle and the cleaning-liquid nozzle.

Then, with an outward movement of the moving means, the atomize nozzle can spray the cleaning liquid and the gas into the holding grooves of the holding member in advance of the cleaning-liquid nozzle. While, with the homeward movement of the moving means, it is possible to firstly make the atomize nozzle spray the gas only and secondly make the dry-gas nozzle and the sequent secondary dry-gas nozzle spray the dry gas. Thus, as the reciprocation of the moving means allows the holding member to be cleaned and dried, it is possible to complete the cleaning and drying operations in a short time and also possible to accomplish miniaturization of the apparatus and an improvement in its reliability.

Further, the feature of the invention resides in that the cleaning and drying apparatus further comprising: a fresh-air suction passage which is formed outside the atomize nozzle, and a gas guide passage which is formed in succession to the fresh-air suction passages to guide the gas along outside faces of the holding member.

Accordingly, when spraying the cleaning liquid and the gas through the atomize nozzle and when spraying the gas for dry, the cleaning liquid or the gas flows along the holding grooves and the side faces of the holding member while the flowing rate is accelerated by ambient air (e.g. clean air) introduced from the fresh-air suction passage. As a result, the cleaning and drying operations can be completed effectively and additionally, the effective utilization of the cleaning liquid and the gas can be realized.

Further, the feature of the invention resides in that the atomize nozzle is inclined to a direction that the holding grooves of the holding member extend.

Thus, since the above formation allows the cleaning liquid and the gas for dry to flow from one side of each holding groove to the other side, it is possible to remove droplets from the holding grooves certainly.

Further, the feature of the invention resides in that the holding member is provided, on a side part thereof, with a plurality of side holding grooves for engagement with respective side parts of the substrates, and the atomize nozzle is arranged so as to oppose the side holding grooves thereby spraying the cleaning liquid and the gas to the side holding grooves of the holding member.

Accordingly, it is possible to clean and dry the holding members for holding respective upper and lower parts of the substrates, sufficiently.

Again, the prevent invention also provides the cleaning and drying apparatus for the substrate holder chuck as claimed in claim 2, further comprising a switching equipment and a pressure regulator both of which are interposed in a gas pipeline connecting the atomize nozzle with a gas source, wherein the controller is capable of controlling a pressure regulating operation of the pressure regulator, the gas of a low pressure controlled by the pressure regulator is supplied by the switching equipment when supplying the cleaning liquid and the gas through the atomize nozzle, and the gas of a high pressure controlled by the pressure regulator is supplied by the switching equipment when supplying only the gas through the atomize nozzle.

Again, the prevent invention also provides the cleaning and drying method for the substrate holder chuck as claimed in claim 13, wherein a supply pressure of the gas in the holding-groove cleaning process of allowing the atomize nozzle to spray the cleaning liquid and the gas into the holding grooves of the holding member, can be controlled lower than a supply pressure of the gas in the holding-groove drying process of allowing the atomize nozzle to spray the gas into the holding grooves of the holding member, thereby suppressing a scattering of the cleaning liquid outside the holding member.

Then, with a lowered supply pressure of the gas, when supplying the gas and the cleaning liquid from the atomize nozzle, it is possible to suppress a scattering of the cleaning liquid etc. to the outside. To the contrary, when drying the holding member, it is possible to sufficiently dry the holding member at a high supply pressure of the dry gas.

According to the other feature of the invention, the cleaning and drying apparatus for the substrate holder chuck further comprising: a positive-pressure chamber formed on at least one side of the atomize nozzle in its moving direction for cleaning the holding member, the positive-pressure chamber allowing the holding member to be inserted thereinto; a gas spray nozzle for spraying a gas into the positive-pressure chamber; a switching equipment interposed in a pipeline connecting the gas spray nozzle with a gas source; and a controller for controlling a switching action of the switching means, wherein when the atomize nozzle sprays the cleaning liquid and the gas into the holding grooves of the holding member, the gas from the gas spray nozzle is sprayed into the positive-pressure chamber by the switching equipment, thereby establishing the positive-pressure chamber under a positive pressure, Furthermore, according to the other feature of the invention, the cleaning and drying apparatus for the substrate holder chuck further comprises: a positive-pressure chamber formed so as to surround the secondary dry-gas nozzle, the positive-pressure chamber allowing the holding member to be inserted thereinto; a switching equipment interposed in a pipeline connecting the secondary dry-gas nozzle with a dry-gas source; and a controller for controlling a switching action of the switching equipment, wherein when the atomize nozzle sprays the cleaning liquid and the gas into the holding grooves of the holding member, the dry gas from the secondary dry-gas nozzle is sprayed into the positive-pressure chamber by the switching equipment, thereby establishing the positive-pressure chamber under a positive pressure, Again, the other feature of the invention resides in the cleaning and drying method for the substrate holder chuck, wherein a positive-pressure chamber is formed on at least one side of the atomize nozzle in its moving direction for cleaning the holding member, the positive-pressure chamber allowing the holding member to be inserted thereinto, and during the holding-groove cleaning process of allowing the atomize nozzle to spray the cleaning liquid and the gas into the holding grooves of the holding member, a gas is supplied into the positive-pressure chamber to establish the positive-pressure chamber under a positive pressure, thereby suppressing a scattering of the cleaning liquid outside the holding member.

Therefore, by establishing a positive pressure state on the side of the atomize nozzle in its moving direction for cleaning at least the holding member during the holding-groove cleaning process that the atomize nozzle sprays the cleaning liquid and the gas into the holding grooves of the holding member, it is possible to suppress a scattering of the cleaning liquid etc. to the outside. In other words, it is possible to prevent a corrosion of peripheral devices due to the scattering of the cleaning liquids including chemical liquids in the circumference of the chuck. Additionally, as it is possible to enhance respective spray pressures of the cleaning liquid and the gas, a process time for cleaning and drying can be shortened.

These and other objects and features of the present invention will become more fully apparent from the following description and appended claims taken in conjunction with the accompany drawings.

DESCRIPTION OF THE PREFERRED EMBODIMENT

Embodiments of the present invention will be described with the accompanying drawings.

Figure 1:
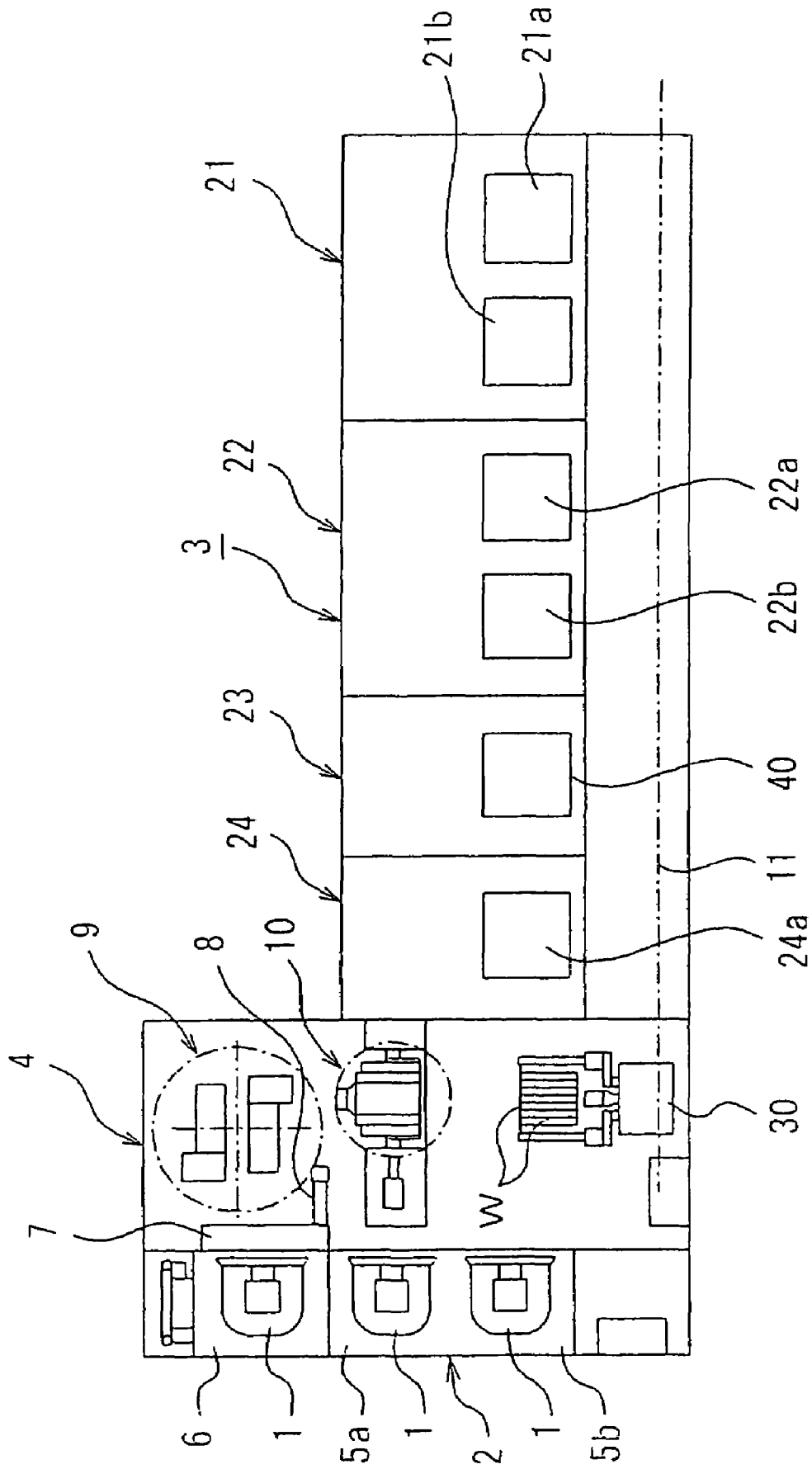
FIG. 1 is a schematic plan view showing one example of a cleaning system for semiconductor wafers, to which a cleaning and drying apparatus for a substrate holder chuck of the present invention is applied.

FIG. 1 is a schematic plan view showing one example of a cleaning system for semiconductor wafers, to which a cleaning and drying apparatus for a substrate holder chuck of the present invention is applied. Note, the substrate holder chuck will be simply referred "chuck", hereinafter.

The cleaning system mainly includes a loading/unloading part 2 for loading and unloading a container (e.g. a carrier 1) accommodating substrates to be processed, for example, semiconductor wafers W (referred "wafers W" after) horizontally, a processing part 3 for processing the wafers W with chemical liquid, cleaning liquid, etc. and subsequently drying them and a delivery part (e.g. an interface part 4) positioned between the loading/unloading part 2 and the processing part 3 to perform delivery of the wafers W, their positional adjustment, posture change, interval adjustment, etc. It is noted that the cleaning system is arranged in a clean room and under a "down-flow" atmosphere where clean air is supplied from a ceiling of the clean room.

In the loading/unloading part 2, a carrier loading part 5a and a carrier unloading part 5b are juxtaposed to each other on one side of the cleaning system. Additionally, the loading/unloading part 2 is provided with a wafer unloading/loading part 6. A not-shown transfer mechanism is arranged between the carrier loading part 5a and the wafer unloading/loading part 6. By this transfer mechanism, the carrier 1 is transferred from the carrier loading part 5a to the wafer unloading/loading part 6.

The processing part 3 includes, in order from the opposite side of the interface part 4 toward itself, a first processing part 21 having a first chemical processing bath 21a for removing particles and organic pollutants from the wafers W and a first water washing bath 21b having a cleaning liquid (e.g. deionized water) overflowing therefrom, a second processing part 22 having a second chemical processing bath 22a for removing metallic pollutants from the wafers W and a second water washing bath 22b having a cleaning liquid (e.g. deionized water) overflowing therefrom, a third processing part 23 equipped with a cleaning and drying apparatus 40 of the invention and a fourth processing part 24 equipped with a cleaning and drying unit 24a for removing an oxidation film from the wafers W and drying them. Note, the third processing part 23 must not necessarily be arranged between the second processing part 22 and the fourth processing part 24. For instance, the same part 23 may be arranged outside the first processing part 21 or between the fourth processing part 24 and the interface part 4.

The above carrier 1 is formed by a container body (not shown) provided, on one side thereof, with a not-shown opening and a lid body (not shown) for closing the opening of the container body. The container body has holding grooves (not shown) formed on its inner wall to hold a plurality of wafers W (e.g. twenty five wafers) at appropriate intervals, horizontally The lid body can be closed and opened by a lid closing device 7 mentioned later.

The wafer unloading/loading part 6 opens to the interface part 4. The lid closing device 7 is arranged at this opening part of the wafer unloading/loading part 6. The not-shown lid body of the carrier 1 is opened or closed by the lid closing device 7. Thus, when the lid closing device 7 detaches the lid body from the carrier 1 accommodating unprocessed wafers W transferred to the wafer unloading/loading part 6, it becomes possible to unload the wafers W out of the carrier 1. After unloading all the wafers W, the lid body can be closed by the lid closing device 7 again. Additionally, when the lid closing device 7 detaches the lid body from the emptied carrier 1 transferred from a carrier standby part to the wafer unloading/loading part 6, it becomes possible to load the wafers W into the carrier 1. After loading the wafers W, the lid body can be closed by the lid closing device 7 again. In the vicinity of the opening part of the wafer unloading/loading part 6, a mapping sensor 8 is arranged to detect the number of wafers W accommodated in the carrier 1.

The interface part 4 includes a wafer transfer arm 9 that holds a plurality of wafers W (e.g. twenty five wafers) horizontally and transfers the wafers W in the horizontal state to and from the carrier 1 in the wafer unloading/loading part 6, later-mentioned interval adjusting means, for example, a pit changer (not shown) that holds the wafers W at predetermined interval vertically, a posture changer 10 arranged between the wafer transfer arm 9 and the pitch changer to change the horizontal posture of the wafers W to the vertical posture and vice versa and positional detecting means, for example, a notch aligner for detecting notches (not shown) of the wafers W in the vertical posture. The interface part 4 is provided with a transfer path 11 continuing into the processing part 3. Movably arranged on the transfer path 11 is a chuck 30 of the invention that can move on the transfer path 11 while holding the wafers W in order to deliver them to any one of the first chemical bath 21a of the first processing part 21, the first wafer washing bath 21b of the same part 21, the second chemical bath 22a of the second processing part 22, the second wafer washing bath 22b of the same part 22 and the cleaning and drying unit 24a of the fourth processing part 24.

In this case, the chuck 30 includes a lower holding member 31 for holding the lower parts of the wafers W and a pair of side holding members 32, 33 for holding peripheral parts of the wafers W on both sides of the lower holding member 31. Each of the holding members 31, 32, 33 has a plurality of holding grooves 31a, 32a, 33a, for example, fifty grooves formed in rows, respectively. In order to prevent deionized water DIW as the cleaning liquid from scattering and adhering to a chuck driving part during the cleaning of the chuck, disk-shaped anti-scattering plates 34 are attached to respective base sides of the holding members 31, 32, 33 perpendicularly to their longitudinal directions. When holding no wafer W, the side holding members 32, 33 are in level with the lower holding member 31. While, when holding the wafers W, the side holding members 32, 33 are moved upward while describing an arc thereby enabling a holding of both sides of the lower parts of the wafers W. These holding members 31, 32, 33 are made of corrosive resistant and chemical resistant resin, for example, polyetheretherketone (PEEK), polychlorotrifluoroethylene (PCTFE) or the like.

The so-constructed chuck 30 receives one lot of unprocessed wafers W (e.g. fifty wafers) from the pitch changer and transfers them to the processing part 3. After processing the wafers W at the processing part 3, the chuck 30 delivers the processed wafers W to the pitch changer. In loading the next lot of wafers W into the processing part 3, the following control is carried out.

For example, when processing the wafers W, it is firstly carried out to charge the wafers W of the first lot into the chemical bath 21a. Subsequently, as soon as the wafer W of the first lot are unloaded from the chemical bath 21a, the wafers W of the second lot are loaded into the chemical bath 21a immediately. In order to prevent the wafers W from being overetched at the chemical baths 21a, 22a, the chuck 30 is controlled so as to stand ready above the chemical bath 21a (or 21b) where the processing is expected to be completed soon. When a finish time of chemical processing overlaps a finish time of water washing or a finish time of drying, by checking for a chemical processing time just before completing the processing, the operation of the chuck 30 is controlled so that the unloading of the wafers W from the chemical baths 21a, 22a is prioritized over the water washing process and the drying process. Alternatively, on consideration of the chemical baths 21a, 22a and the water washing baths 21b, 22b as being one group of processing, the chuck 30 may be controlled in a manner that the only one lot is loaded into one group. Then, since such a control allows the water washing baths 21a, 21b to be certainly available at the point of completing the chemical processing, it is possible to prevent an occurrence of overetching.

Next, the cleaning and drying apparatus 40 for the chuck of the present invention will be described with reference to the accompanying drawings, in detail.

1st. Embodiment

Figure 2:
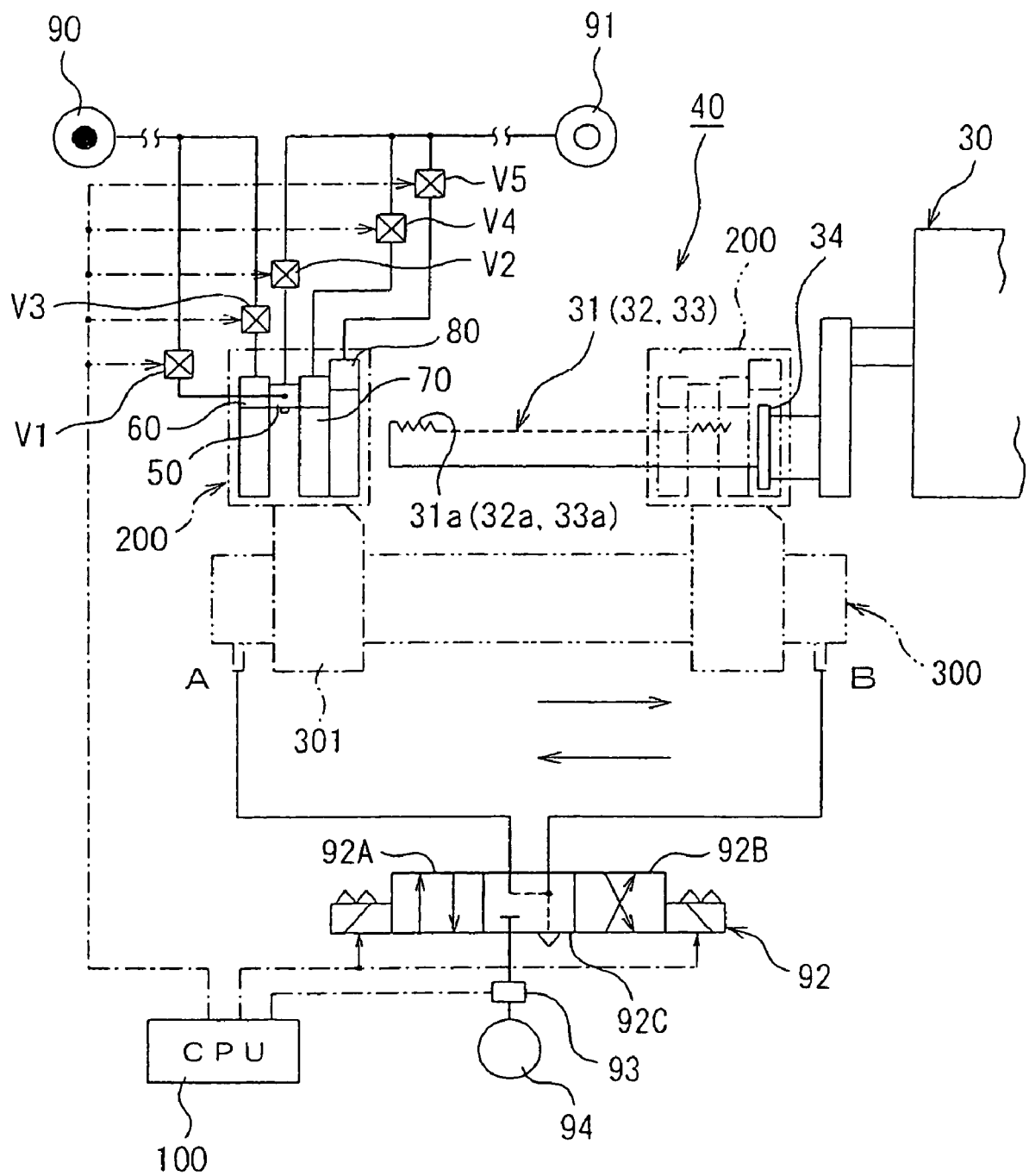
FIG. 2 is a schematic structural view showing the cleaning and drying apparatus for the substrate holder chuck in accordance with the first embodiment of the present invention.
Figure 3:
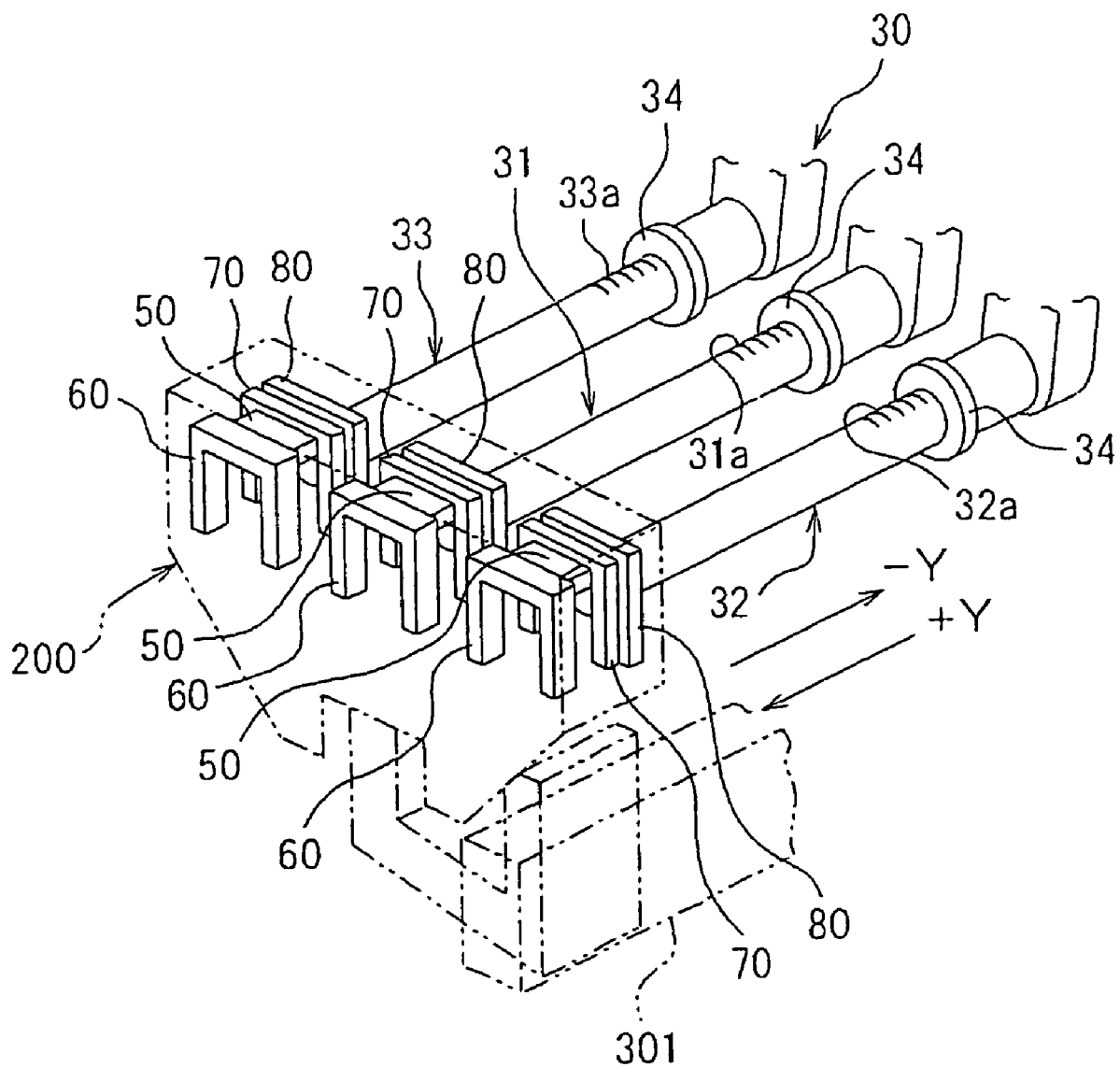
FIG. 3 is a schematic perspective view showing cleaning and drying nozzles and the chuck of the first embodiment.

FIG. 2 is a schematic sectional view showing the cleaning and drying apparatus 40 for the chuck in accordance with the first embodiment of the invention. FIG. 3 is a schematic perspective view showing cleaning and drying nozzles and the chuck of the first embodiment.

As shown in FIGS. 2, 3, 4A, 4B and 5A to 5C, the cleaning and drying apparatus 40 of the above chuck includes a atomize nozzle 50 for spraying a cleaning liquid, for example, deionized water and gas, for example, nitrogen ($N_2$) gas to respective holding grooves 31a of the holding member 31 that is representative of the other holding members 32 and 33, a cleaning-liquid nozzle 60 for spraying the deionized water DIW as the cleaning liquid to side faces 31b of the holding member 31, a primary dry-gas nozzle 70 for spraying a dry gas, for example, $N_2$-gas to the holding grooves 31a and the side faces 31b of the holding member 31 and a secondary dry-gas nozzle 80 for spraying $N_2$-gas as the dry gas to the holding grooves 31a, lower parts 31c of the side faces 31b of the holding member 31 and its base end, that is, the anti-scattering plate 34. Note, for the dry gas, $N_2$-gas may be replaced by clean air.

Figure 4A:
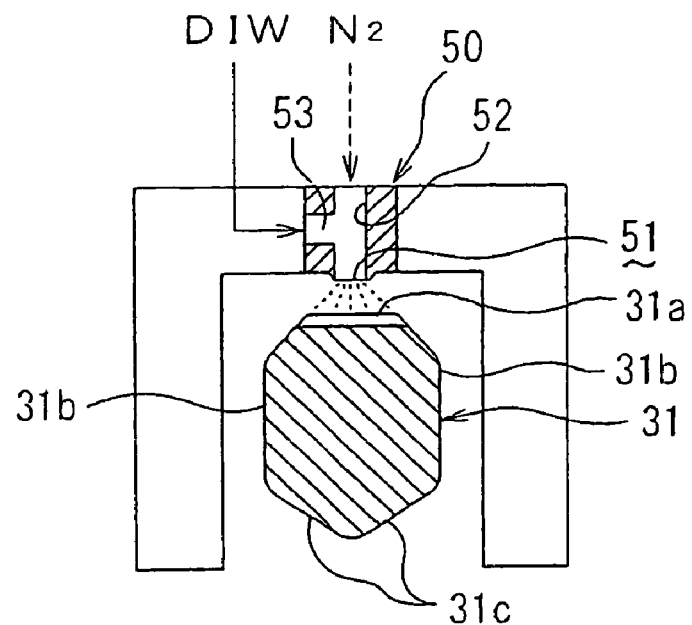
FIG. 4A is a sectional view showing a cleaning state of a atomize nozzle of the present invention and FIG. 4B is a sectional view showing a cleaning state of a cleaning-liquid nozzle of the present invention.

As shown in FIG. 4A, the atomize nozzle 50 has a converging passage consisting of a $N_2$-gas passage 52 communicating with a nozzle hole 51 positioned above the holding grooves 31a of the holding member 31 and a deionized-water passage 53. The deionized-water passage 53 is connected to a deionized-water (DIW) source 90 through a first valve V1. While, the $N_2$-gas passage 52 is connected to a $N_2$-gas source 91 through a second valve V2. Both of the first valve V1 and the second valve V2 constitute switching means. The opening/closing conditions of the first valve V1 and the second valve V2 are controlled on a basis of control signals from later-mentioned control means, such as a CPU 100. Consequently, the fluid supplied from the atomize nozzle 50 to the holding grooves 31a of the holding member 31 can be changed among a combination of deionized water DIW and $N_2$-gas, only DIW and only $N_2$-gas, selectively. Note, the first valve V1 and the second valve V2 may be replaced by a switching valve that can selectively switch a distribution of deionized water DIW and $N_2$-gas to another distribution of $N_2$-gas only and vice versa.

According to the atomize nozzle 50 constructed above, as it allows both gas (e.g. $N_2$-gas) and cleaning liquid (e.g. deionized water DIW) to be ejected to the holding grooves 31a of the holding member 31, it is possible to enhance a spray pressure in comparison with a spray pressure in case of spraying the deionized water DIW only. As a result, it is possible to remove (rinse out) chemical liquids, contaminants, such as particles, etc. from the holding grooves 31a certainly.

Figure 6:
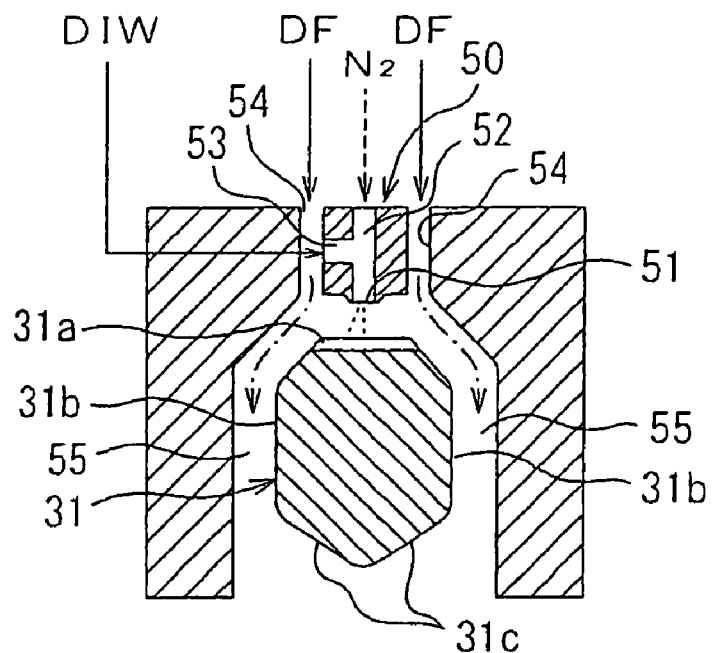
FIG. 6 is a sectional view showing another embodiment of the atomize nozzle.

In place of the atomize nozzle 50, as shown in FIG. 6, fresh-air suction passages 54 may be formed outside the atomize nozzle 50 and additionally, gas guide passages 55 may be formed in succession to the fresh-air suction passages 54 to guide the flowing of gas along the outside faces 31b of the holding member 31. In this modification, when spraying the deionized water DIW/$N_2$-gas or $N_2$-gas via the atomize nozzle 50, the flow velocity of deionized water DIW and $N_2$-gas along the holding grooves 31a and the side faces 31b of the holding member 31 is increased by the fresh air (e.g. downflow DF and fresh air) introduced from the fresh-air suction passage 54. Then, it is possible to clean and dry the holding member 31 effectively and also possible to utilize the deionized water DIW and $N_2$-gas effectively.

Figure 7:
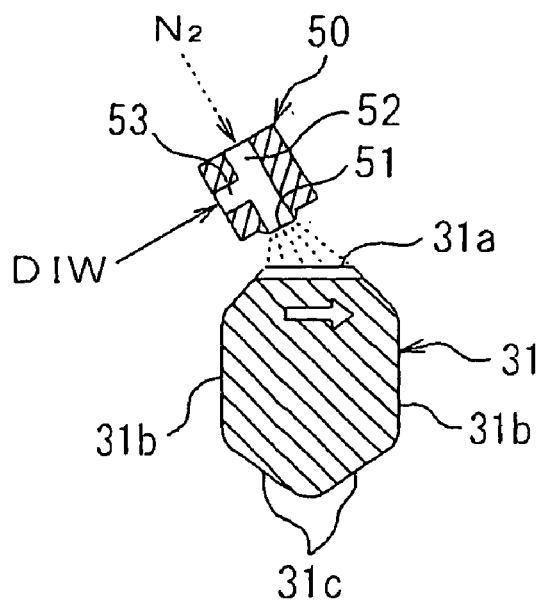
FIG. 7 is a sectional view showing a further embodiment of the atomize nozzle.

Alternatively, as shown in FIG. 7, the atomize nozzle 50 may be inclined to the forming direction of the holding grooves 31a of the holding member 31. Then, since such an inclined formation allows the deionized water DIW and $N_2$-gas to flow from one side of each holding groove 31a to the other side, it is possible to remove contaminants from the holding grooves 31a more certainly and also possible to remove droplets adhering to the holding grooves 31a certainly.

Figure 4B:
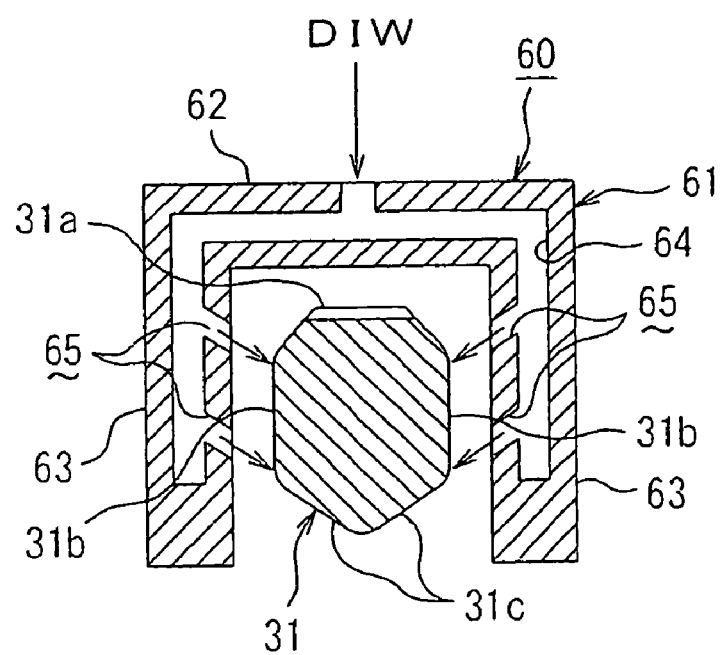

As shown in FIG. 4B, the cleaning-liquid nozzle 60 includes an arch-shaped nozzle body 61, a deionized-water communication passage 64 formed in both a horizontal part 62 and leg parts 63 both forming the nozzle body 61 and two nozzle holes 65 communicating with the deionized-water communication passage 64 at each leg part 63. The cleaning-liquid nozzle 60 constructed above is connected to the deionized-water source 90 through a third valve V3, allowing the deionized-water DIW from the deionized-water source 90 to be sprayed to both of the side faces 31b of the holding member 31 through the nozzle holes 65.

Figure 5A:
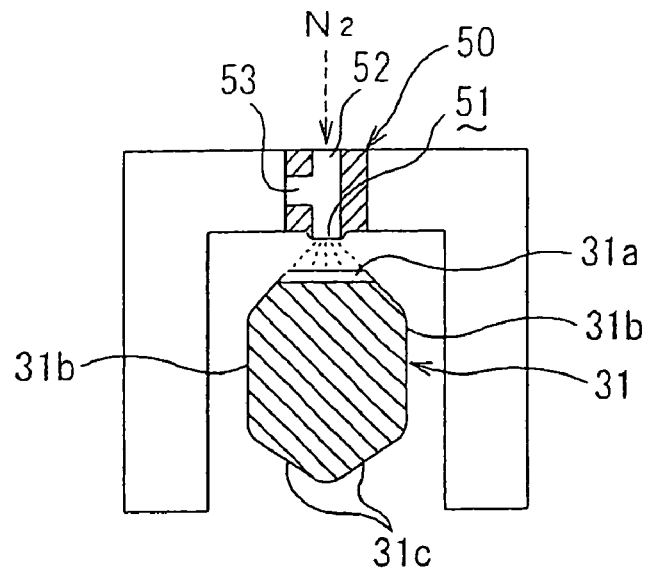
FIG. 5A is a sectional view showing a drying state of the atomize nozzle of the present invention, FIG. 5B a sectional view showing a drying state of a primary dry-gas nozzle of the present invention
Figure 5B:
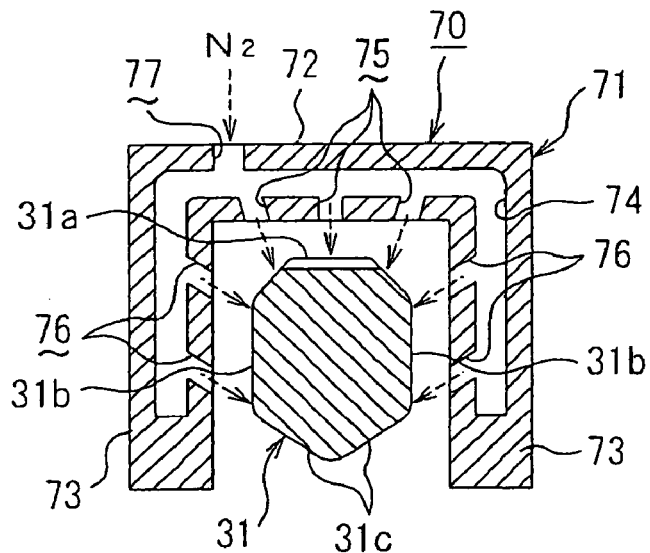
FIG. 5C is a sectional view showing a drying state of a secondary dry-gas nozzle of the present invention.

As shown in FIG. 5B, the primary dry-gas nozzle 70 includes, similarly to the cleaning-liquid nozzle 60, an arch-shaped nozzle body 71 surrounding the holding member 31, a $N_2$-gas communication passage 74 formed in both a horizontal part 72 and leg parts 73 both forming the nozzle body 71, three spray nozzle holes 75 communicating with the $N_2$-gas communication passage 74 at the horizontal part 72 to spray $N_2$-gas into the holding grooves 31a, two spray nozzle holes 76 communicating with the $N_2$-gas communication passage 74 at each leg part 73 to spray $N_2$-gas to the side face 31b and a $N_2$-gas port 77 communicating with the $N_2$-gas communication passage 74 at one side of the horizontal part 72.

In the primary dry-gas nozzle 70 constructed above, the $N_2$-gas port 77 is connected to the $N_2$-gas source 91 through a fourth valve V3, allowing $N_2$-gas from the $N_2$-gas source 91 to be sprayed to the holding grooves 31a and the side faces 31b of the holding member 31.

Figure 5C:
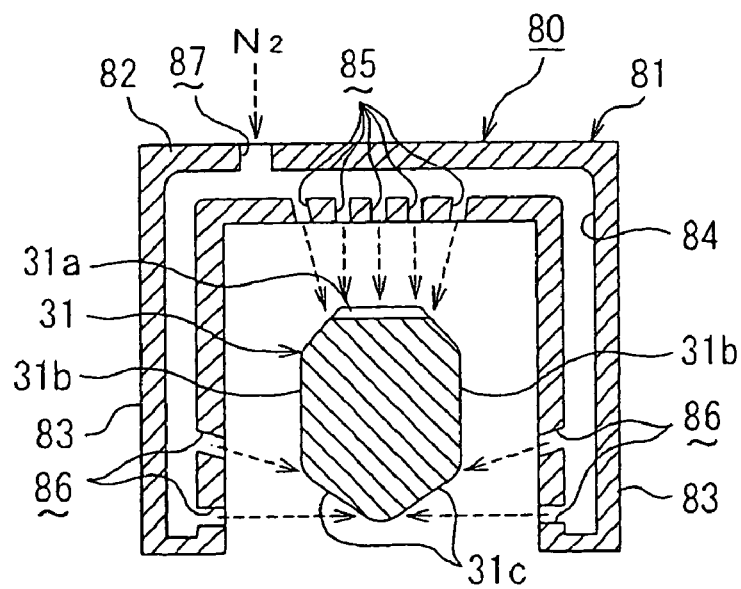

As shown in FIG. 5C, the secondary dry-gas nozzle 80 includes an arch-shaped nozzle body 81 formed somewhat larger than the primary dry-gas nozzle 70 to surround the holding member 31 and the anti-scattering plate 34, a $N_2$-gas communication passage 84 formed in both a horizontal part 82 and leg parts 83 both forming the nozzle body 81, five spray nozzle holes 85 communicating with the $N_2$-gas communication passage 84 at the horizontal part 82 to spray $N_2$-gas into the holding grooves 31a, two spray nozzle holes 86 communicating with the $N_2$-gas communication passage 84 at each leg part 83 to spray $N_2$-gas to the lower parts 31c and a $N_2$-gas port 87 communicating with the $N_2$-gas communication passage 84 at one side of the horizontal part 82.

In the secondary dry-gas nozzle 80 constructed above, the $N_2$-gas port 87 is connected to the $N_2$-gas source 91 through a fifth valve V3, allowing $N_2$-gas from the $N_2$-gas source 91 to be sprayed to the holding grooves 31a of the holding member 31, the lower parts 31c and also the anti-scattering plate 34 at the base end of the member 31. Then, as the number (seven) of nozzle holes 85, 86 of the nozzle 80 is larger than the number (five) of nozzle holes 75, 76 of the nozzle 70, the nozzle 80 sprays $N_2$-gas at a spray pressure smaller than that of the nozzle 70, thereby completing a finishing drying while preventing the cleaning liquid (DIW) from adhering to the holding grooves 31a and the side faces 31b that haven been dried by the primary dry-gas nozzle 70, as possible.

The above valves V1 to V5 are formed by air operational valves and connected to the CPU 100 as the control means of the invention. Based on control signals from the CPU 100, the opening/closing states of these valves V1 to V5 are determined respectively. Note, both of the first valve V1 and the second valve V2 do constitute the switching means of the invention.

The atomize nozzle 50, the cleaning-liquid nozzle 60, the primary dry-gas nozzle 70 and the secondary dry-gas nozzle 80 are all arranged in a nozzle box 200.

The nozzle box 200 is provided, on its lower portion, with a cover part that opens downwardly. By the cover part, it is suppressed that the cleaning liquid etc. at cleaning and drying scatters in the circumference of the nozzle box 200 laterally. This nozzle box 200 is connected to moving means, for example, a movable part 301 of an air cylinder 300, allowing the box 200 to reciprocate along the longitudinal direction of the holding member 31 horizontally. According to this embodiment, there are arranged, in a direction from the tip side toward the base side in the reciprocation of the air cylinder 300 (i.e. in the moving direction from the tip side of the holding member 31 toward the base side of the same member 31), the secondary dry-gas nozzle 80, the primary dry-gas nozzle 70, the atomize nozzle 50 and the cleaning-liquid nozzle 60, in order. With the arrangement of these nozzles, the miniaturization of the apparatus and the improvement in reliability can be accomplished. Additionally, with the reciprocation of the nozzle box 200 due to the air cylinder 300, it is possible to clean and dry the holding member 31 effectively. In detail, in the outward course of the nozzle box 200 in reciprocation, the atomize nozzle 50 sprays $N_2$-gas and the deionized water DIW into the holding grooves 31a of the holding member 31 and continuously, the cleaning-liquid nozzle 60 sprays the deionized water DIW to the side faces 31b of the holding member 31, thereby completing the cleaning of the holding member 31. Meanwhile, in the homeward course of the nozzle box 200 in reciprocation, the atomize nozzle 50 sprays $N_2$-gas only into the holding grooves 31a of the holding member 31 and additionally, the primary dry-gas nozzle 70 sprays $N_2$-gas into the holding grooves 31a and the side faces 31b of the holding member 31. Further, the secondary dry-gas nozzle 80 sprays $N_2$-gas into the holding grooves 31a and the lower parts 31c of the holding member 31 and also the anti-scattering plate 34 at the base end of the member 31. In this way, the drying operation of the holding member 31 is completed.

The air cylinder 300 is provided, on both ends thereof, with ports A and B which are connected to an air source 94 through a 4-port/3-position valve 92 and a flow control valve 93. The 4-port/3-position valve 92 and the flow control valve 93 are electrically connected to the CPU 100. Thus, based on the control signals from the CPU 100, the state of the 4-port/3-position valve 92 can be switched among its outward movement position 92A, a homeward movement position 92B and a neutral (standstill) position 92C and additionally, the flow rate of air can be controlled.

With the above constitution, when the CPU 100 outputs a control signal allowing the 4-port/3-position valve 92 to occupy the outward movement position 92A, the air from the air source 94 is supplied into the port A of the air cylinder 300 while discharging air in the air cylinder 300 from the port B. Then, the nozzle box 200 moves from the tip side of the holding member 31 to the base side (i.e. the outward movement). On the other hand, when the CPU 100 outputs a control signal allowing the 4-port/3-position valve 92 to occupy the homeward movement position 92B, the air from the air source 94 is supplied into the port B of the air cylinder 300 while discharging air in the air cylinder 300 from the port A. Then, the nozzle box 200 moves from the base side of the holding member 31 to the tip side (i.e. the homeward movement).

Next, the cleaning and drying operation of the chuck 30 will be described with reference to FIGS. 4A, 4B and 5A to 5C.

First, on condition of allowing the nozzle box 200 to stand ready outside the tip of the holding member 31, the position of the 4-port/3-position valve 92 is switched to the outward movement position 92A, so that the nozzle box 200 moves in a "−Y" direction from the tip side of the holding member 31 to the base side (the outward movement). Then, the first valve V1 and the second valve V2 are together opened under the control signals from the CPU 100, so that the atomize nozzle 50 sprays $N_2$-gas and the deionized water DIW into the holding grooves 31a of the holding member 31, removing the chemical liquids and contaminants, such as particles, from the holding grooves 31a (in a holding-groove cleaning process). Meanwhile, the cleaning-liquid nozzle 60 sprays the deionized water DIW to the side faces 31b of the holding member 31, so that the contaminants flowing out of the holding grooves 31a are removed from the side faces 31b (in a side-face cleaning process). This cleaning operation consisting of the holding-groove cleaning process and the side-face cleaning process is performed within the compass from the tip of the holding member 31 up to its base end, for example, 300 mm for a certain period, e.g. 6 sec.

After completing the cleaning operation (the holding-groove cleaning process and the side-face cleaning process) in the above way, the position of the 4-port/3-position valve 92 is switched to the neutral position 92C under the control signal from the CPU 100, so that the movement of the nozzle box 200 is stopped and the first and third valves V1, V3 are closed while the fourth and fifth valves V4, V5 are opened. Consequently, by $N_2$-gas sprayed from the spray nozzle holes 85, 86 of the secondary dry-gas nozzle 80, the droplets are removed from the anti-scattering plate 34 to dry it.

After a predetermined period (e.g. 2 sec.) has passed since the standstill of the nozzle box 200, the position of the 4-port/3-position valve 92 is switched to the homeward movement position 92B under the control signal from the CPU 100, so that the nozzle box 200 moves from the base side of the holding member 31 to the tip side in a "+Y" direction (i.e. the homeward movement). Then, the atomize nozzle 50 sprays $N_2$-gas only into the holding grooves 31a of the holding member 31 to dry them (i.e. holding-groove drying process). Next, the primary dry-gas nozzle 70 side faces 31b sprays $N_2$-gas to the holding grooves 31a and the side faces 31b of the holding member 31 to dry them (i.e. primary drying process) and subsequently, the secondary dry-gas nozzle 80 sprays $N_2$-gas whose spray pressure is smaller than that of the primary dry-gas nozzle 70, to the holding grooves 31a, the lower parts 31c of the side faces 31b and the base end of the holding member 31 (secondary drying process). In this way, it is possible to accomplish the drying operation in a short time and effectively and also possible to clean and dry the holding member 31 certainly, whereby the throughput of the whole apparatus can be improved. Thus, in comparison with the conventional arrangement where the cleaning operation and the drying operation are carried out by the cleaning-liquid nozzle and the dry-gas nozzle that are separated from each other, the cleaning and drying apparatus of the invention is capable of cleaning and drying operations in a short time.

2nd Embodiment

Figure 8:
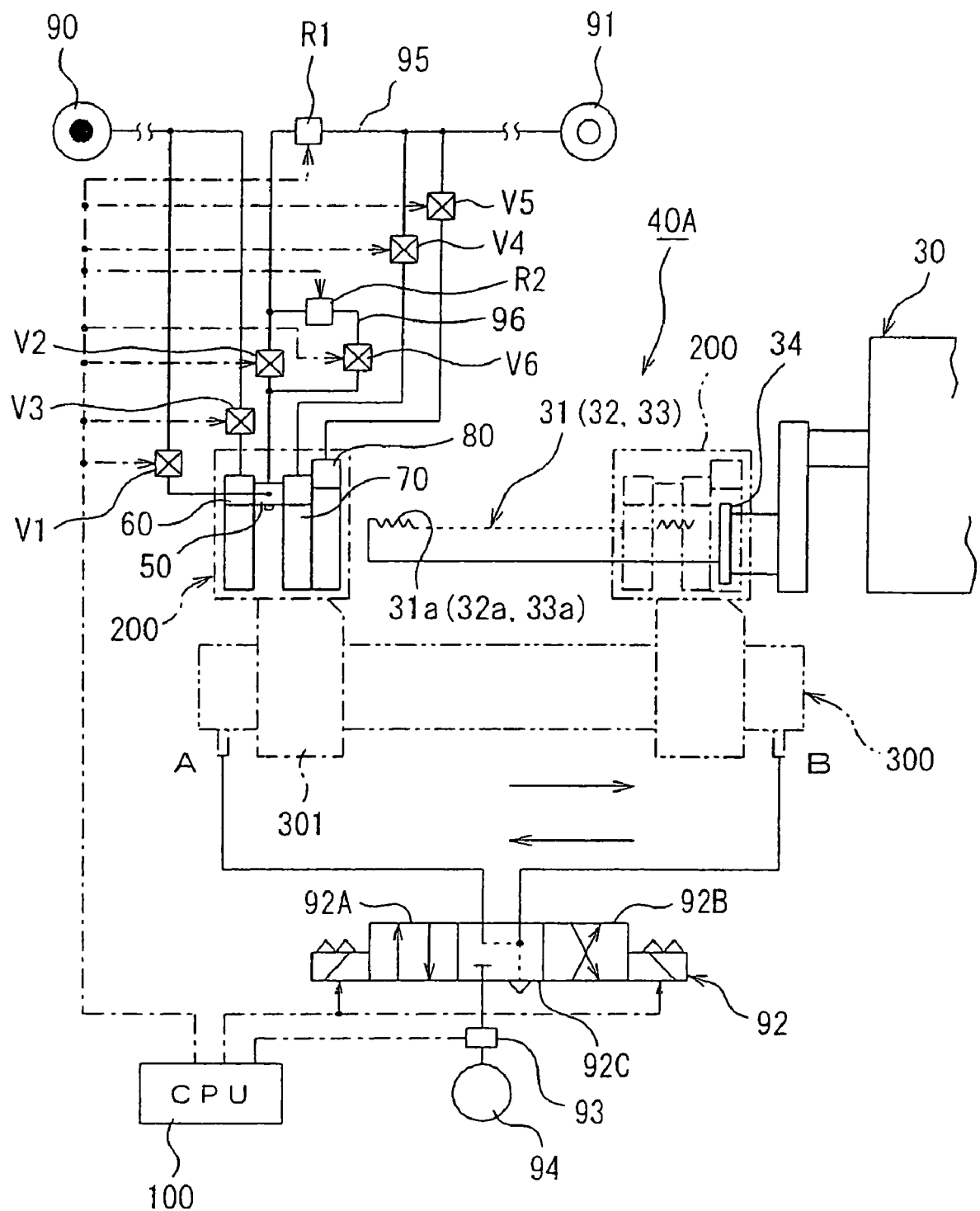
FIG. 8 is a schematic structural view showing the cleaning and drying apparatus for the substrate holder chuck in accordance with the second embodiment of the present invention.

FIG. 8 is a schematic sectional view showing the cleaning and drying apparatus for the chuck, in accordance with the second embodiment of the invention.

The second embodiment is directed in order to prevent a corrosion of peripheral devices etc. that might be caused by a scattering of the cleaning liquid etc. in the circumference of the chuck during the cleaning operation (i.e. the holding-groove cleaning process).

In the cleaning and drying apparatus 40A of this embodiment, as shown in FIG. 8, the valve V2 as the switching means (corresponding to the second valve in the first embodiment) is interposed in a gas pipeline 95 connecting the atomize nozzle 50 with the $N_2$-gas source 91 as the gas source. On the primary side of the valve V2, a first regulator R1 as the first pressure regulating means is interposed in the gas pipeline 95. A sixth valve V6 as auxiliary switching means is interposed in a branch pipeline 96 connecting the primary side of the valve V2 with the secondary side of the valve V2. On the primary side of the valve V6, a second regulator R2 as the second pressure regulating means is interposed in the branch pipeline 96. The valves V2, V6 and the regulators R1, R2 are respectively connected to the CPU 100 as the control means electrically. Based on control signals from the CPU 100, the opening/closing operations of the valves V1, V2 and the pressure adjustments of the regulators R1, R2 are controlled.

With the above-mentioned constitution, when spraying the gas (e.g. $N_2$-gas) and the cleaning liquid (e.g. deionized water) into the holding grooves 31a of the holding member 31 via the atomize nozzle 50 at the holding-groove cleaning process, the valve V2 is closed while opening the valve V6 and the supply pressure of $N_2$-gas is controlled to be a low pressure (e.g. 0.2 MPa) due to the pressure adjustment of the regulator R2. At the holding-groove drying process, the valve V6 is closed while the valve V2 is opened and the supply pressure of $N_2$-gas is controlled to be a high pressure (e.g. 0.35 MPa) due to the pressure adjustment of the regulator R1, allowing $N_2$-gas only to be sprayed into the holding grooves 31a of the holding member 31.

Thus, according to the second embodiment, since both spray pressures of $N_2$-gas and deionized water DIW can be reduced at the holding-groove cleaning process, it is possible at drying to dry the holding member 31 with a sufficient supply pressure while suppressing a scattering of the cleaning liquid etc to the outside.

Noted, in the second embodiment, the other elements are identical to those of the first embodiment respectively. Therefore, elements identical to those of the first embodiment are indicated with the same reference numerals and their overlapping descriptions are eliminated.

In the above-mentioned arrangement, the first regulator R1 and the second regulator R2 are interposed in the gas pipeline 95 and the branch pipeline 96, respectively and together controlled by the CPU 100. However, the above effect must not necessary be provided by the above arrangement. For example, if not employing the branch pipeline 96 and the second regulator R2 but providing the first regulator R1 in the form of an electropneumatic regulator controllable by the CPU 100, then it becomes possible at the holding-groove cleaning process to reduce the supply pressures of $N_2$-gas and deionized water DIW as well as the above arrangement. Namely, it is possible at drying to dry the holding member 31 with a sufficient supply pressure while suppressing a scattering of the cleaning liquid etc to the outside.

3rd. Embodiment

Figure 9:
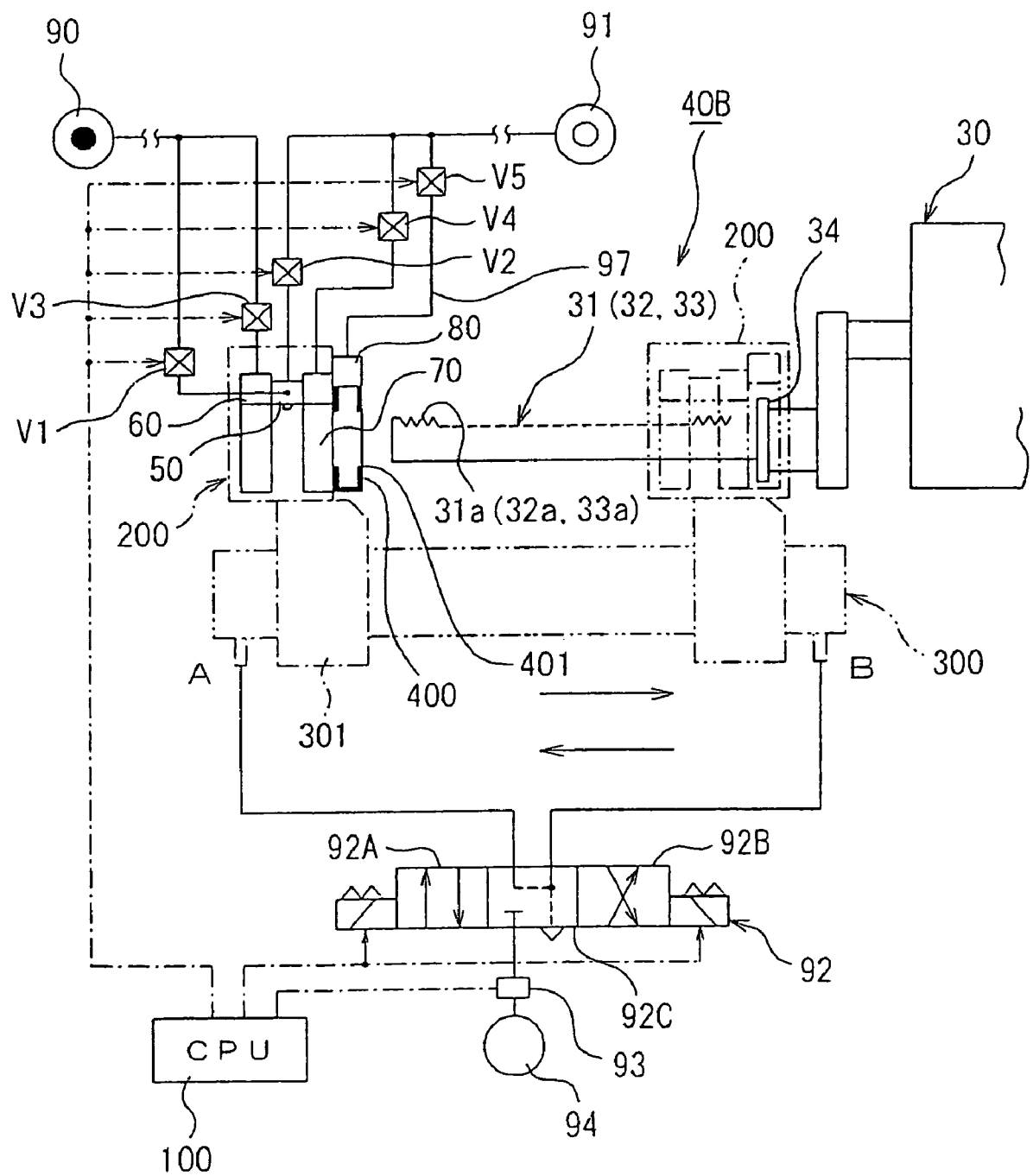
FIG. 9 is a schematic structural view showing the cleaning and drying apparatus for the substrate holder chuck in accordance with the third embodiment of the present invention.
Figure 10:
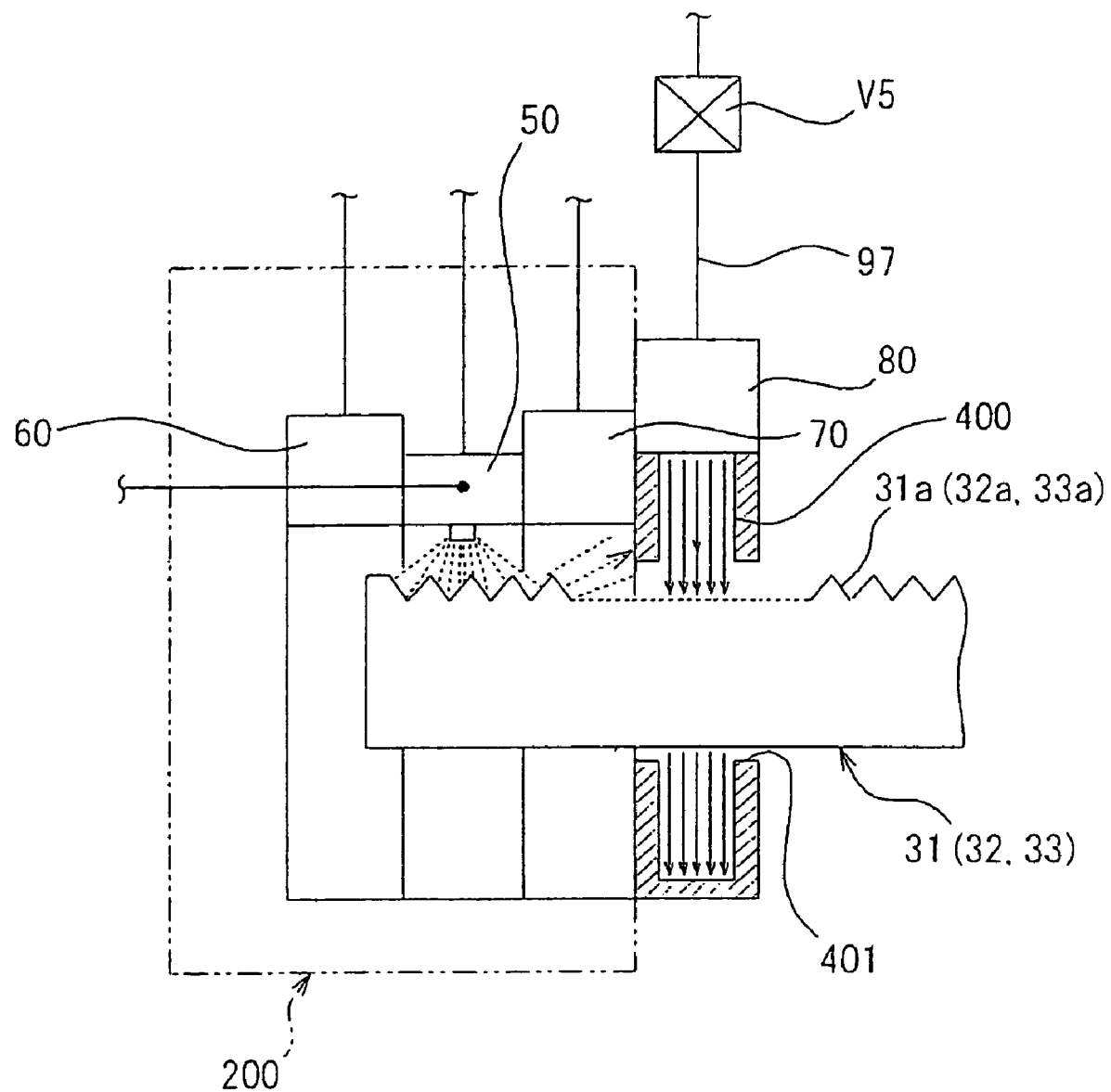
FIG. 10 is a sectional view showing a cleaning state of holding grooves in the third embodiment.

FIG. 9 is a schematic sectional view showing the cleaning and drying apparatus in accordance with the third embodiment of the present invention. FIG. 10 is a schematic sectional view showing the holding-groove cleaning state of the apparatus in the third embodiment.

The third embodiment is directed in order to suppress a scattering of the cleaning liquid etc. in the circumference of the chuck during the cleaning operation (i.e. the holding-groove cleaning process) thereby preventing a corrosion of the peripheral devices etc. and also directed to shorten the cleaning and drying process time thereby improving the efficiency in processing.

According to the third embodiment, a positive-pressure chamber 400 is formed on one side of the atomize nozzle 50 in its moving direction for cleaning at least the holding members 31, 32, 33 of the chuck 30, which will be represented by a reference numeral 31, hereinafter. The positive-pressure chamber 400 is formed so as to allow the holding member 31 to be inserted thereinto. In operation, during the holding-groove cleaning process that the atomize nozzle 50 sprays the gas (e.g. $N_2$-gas) and the cleaning liquid (e.g. deionized water) into the holding grooves 31a of the holding member 31, $N_2$-gas is sprayed into the positive-pressure chamber 400 to make it under a positive pressure. Consequently, in addition to the suppression of a scattering of the cleaning liquid etc. to the outside, the spray pressures of $N_2$-gas and the deionized water are together enhanced to shorten the cleaning and drying process time.

In detail, as shown in FIGS. 9 and 10, the positive-pressure chamber 400 is arranged so as to surround the secondary dry-gas nozzle 80 and also provided with an insertion port 401 allowing an insertion of the holding member 31 of the chuck 30. The valve V5 as the switching means (corresponding to the fifth valve in the first embodiment) is interposed in a pipeline 97 for connecting the secondary dry-gas nozzle 80 to the $N_2$-gas source 91. The valve V5 is connected to the CPU 100 electrically. Based on the control signal from the CPU 100, when $N_2$-gas and the deionized water are sprayed from the secondary dry-gas nozzle 80 into the holding grooves 31a of the holding member 31, the valve V5 operates to allow the secondary dry-gas nozzle 80 to spray $N_2$-gas into the positive-pressure chamber 400 thereby establishing its interior under a positive pressure.

With the above-mentioned constitution, the valve V5 opens during the holding-groove cleaning process, so that $N_2$-gas is sprayed from the secondary dry-gas nozzle 80 into the positive-pressure chamber 400 thereby establishing its interior under a positive pressure. In other words, a so-called "air curtain" is formed in a gap between the holding member 31 and the positive-pressure chamber 400. Consequently, it is suppressed that $N_2$-gas and the deionized water sprayed from the atomize nozzle 50 fly to the outside. It is possible to prevent the peripheral devices etc. from being eroded due to adhesion of the cleaning liquid etc. to the devices. Additionally, the suppression of scattering of the cleaning liquid etc. to the outside allows the spray pressures of $N_2$-gas and the deionized water to be enhanced and furthermore, $N_2$-gas is sprayed from the secondary dry-gas nozzle 80 at drying. As a result, it is possible to shorten the cleaning and drying process time.

In the above-mentioned arrangement, the positive-pressure chamber 400 is established in the vicinity of the secondary dry-gas nozzle 80. However, the positive-pressure chamber 400 must not necessary be formed in the position of the secondary dry-gas nozzle 80. For instance, the positive-pressure chamber 400 may be formed in the region of the primary dry-gas nozzle 70. Alternatively, the positive-pressure chamber 400 may be formed independently of the nozzles 70, 80. Then, $N_2$-gas is sprayed from an additional gas nozzle in order to make the interior of the positive-pressure chamber 400 under a positive pressure.

Again, although the positive-pressure chamber 400 is arranged on one side of the nozzle box 200 in its moving direction to the holding member 31 in the shown embodiment, the positive-pressure chamber 400 and the gas nozzle may be arranged on the opposite side of the box 200.

Noted, in the third embodiment, the other elements are identical to those of the first embodiment respectively. Therefore, elements identical to those of the first embodiment are indicated with the same reference numerals respectively and. their overlapping descriptions are eliminated.

4$^{th}$. Embodiment

Figure 11:
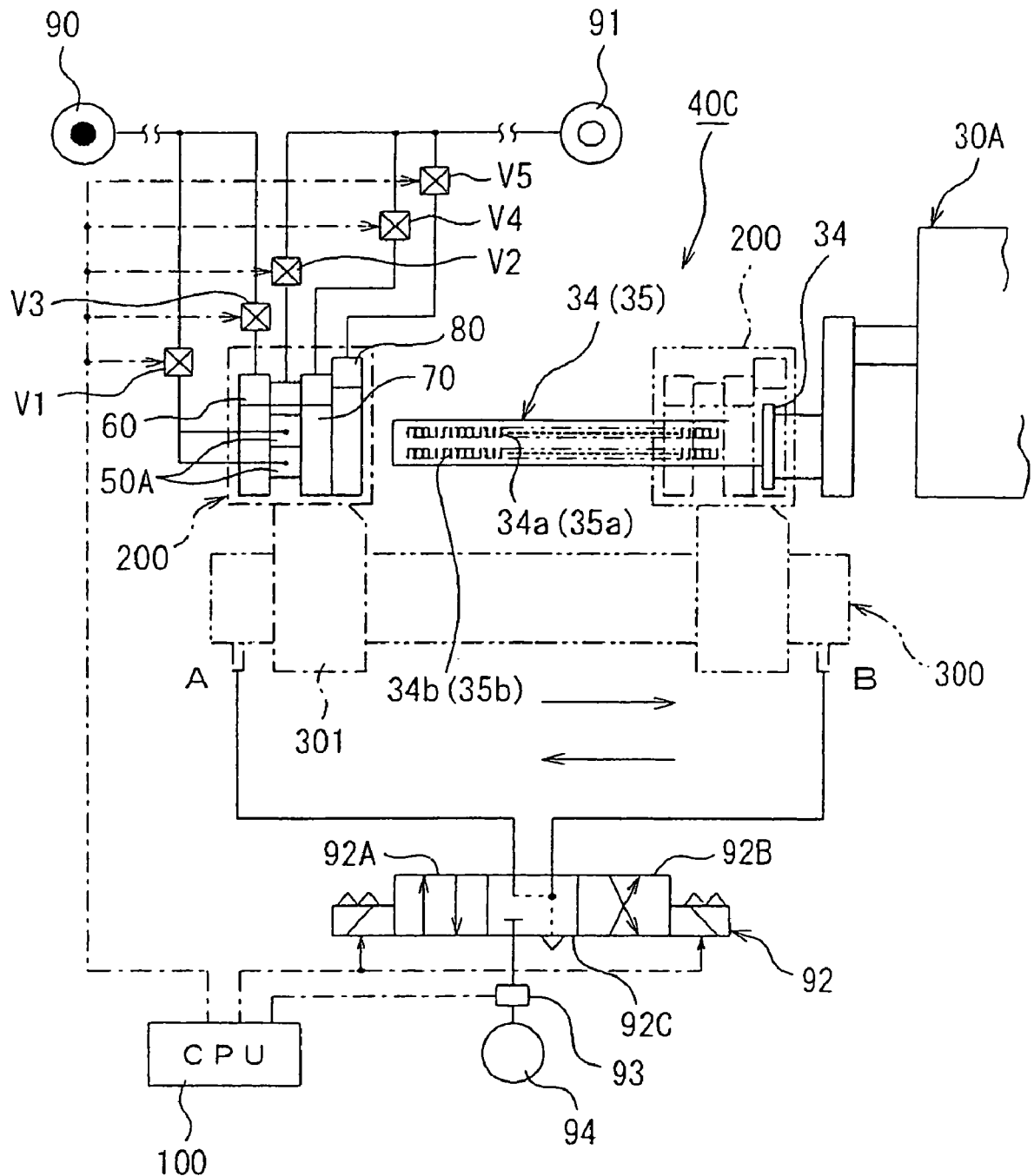
FIG. 11 is a schematic structural view showing the cleaning and drying apparatus for the substrate holder chuck in accordance with the fourth embodiment of the present invention.
Figure 12:
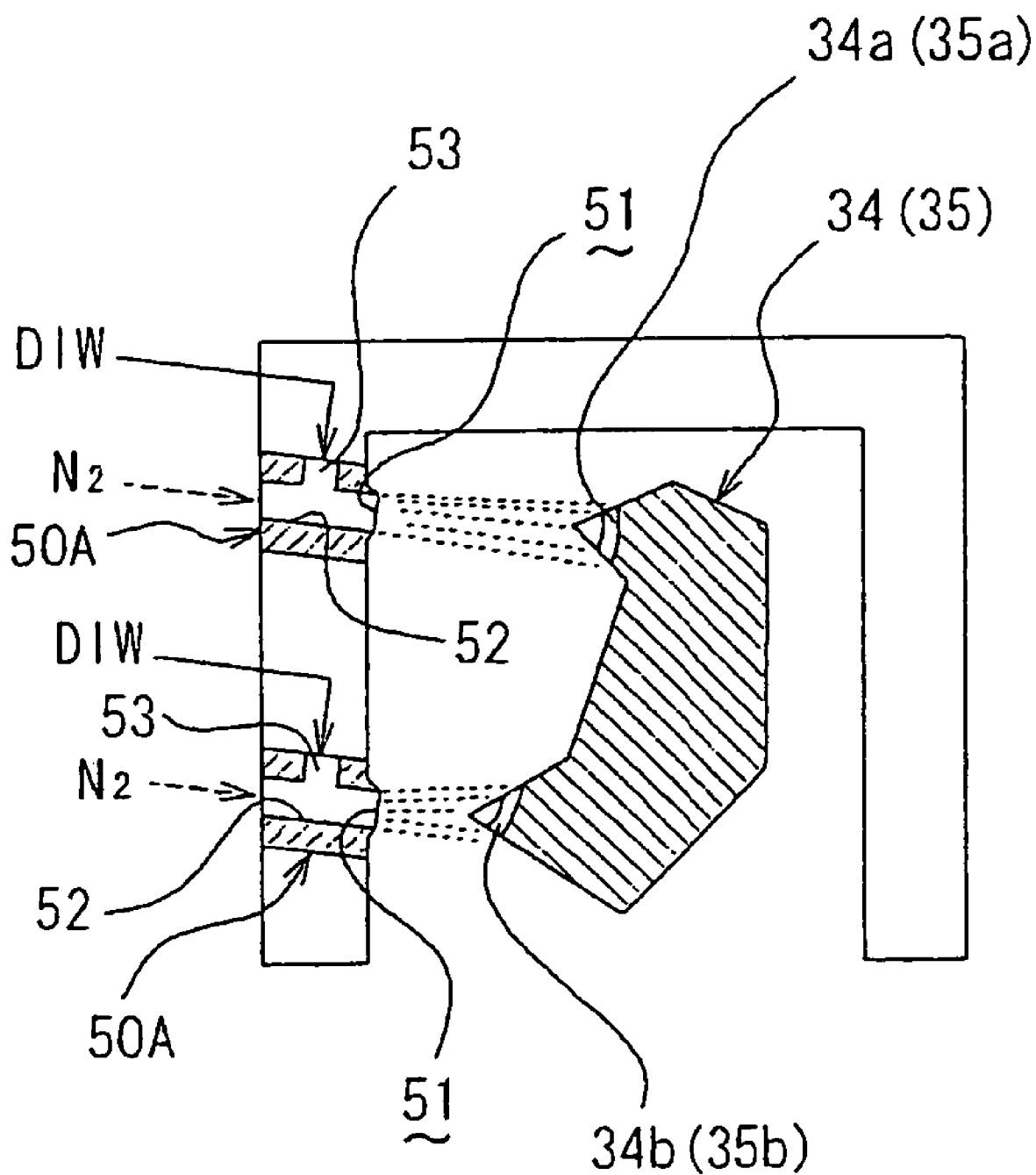
FIG. 12 is a sectional view showing a cleaning state of holding grooves in the fourth embodiment.

FIG. 11 is a schematic sectional view showing the cleaning and drying apparatus in accordance with the fourth embodiment of the present invention. FIG. 12 is a schematic sectional view showing the holding-groove cleaning state of the apparatus in the fourth embodiment.

In common with the afore-mentioned embodiments, the chuck 30 is equipped with one lower holding member 31 for holding respective lower parts of the wafers W and a pair of side holding members 32, 33 for holding peripheral parts of the wafers W on both sides of the member 31. However, the present invention is applicable to a chuck equipped with a pair of holding members for respective upper and lower parts of the wafers W.

As shown in FIGS. 11 and 12, a chuck 30A of this embodiment is equipped with one pair of holding members 34, 35 having upper holding grooves 34$a$, 35$a$ for holding the upper parts of the wafers W and lower holding grooves 34$b$, 35$b$ for holding the lower parts of the wafers W.

According to the fourth embodiment, there are provided two atomize nozzles 50A for spraying $N_2$-gas and the deionized water into the upper holding grooves 34$a$, 35$a$ and the lower holding grooves 34$b$, 35$b$. Additionally, the cleaning-liquid nozzle 60, the primary dry-gas nozzle 70 and the secondary dry-gas nozzle 80 are formed so as to spray $N_2$-gas and the deionized water DIW, similarly to the first embodiment.

Noted, in the fourth embodiment, the other elements are identical to those of the first embodiment respectively. Therefore, elements identical to those of the first embodiment are indicated with the same reference numerals respectively and their overlapping descriptions are eliminated.

Also in this embodiment, it is a matter of course that the apparatus can be constructed as similar to those in the second and third embodiments.

In the above-mentioned embodiments, the cleaning and drying operations are carried out by moving the nozzle box 200 including the atomize nozzle 50, the cleaning-liquid nozzle 60 and the primary and secondary dry-gas nozzles 70, 80 to the holding member 31. In the modification, on condition of fixing the nozzle box 200, it may be carried out to reciprocate the holding member 20 along the longitudinal direction of the member 31 horizontally. Alternatively, a relative movement may be caused between the holding member 31 and the nozzle box 200 along the longitudinal direction of the member 31 horizontally.

In the above embodiments, the cleaning and drying apparatus (method) of the invention is applied to a semiconductor holder chuck. Nevertheless, as a matter of course, the present invention is also applicable to the other substrates besides a semiconductor wafer, for example, a LCD glass substrate. Furthermore, although the cleaning and drying apparatus is embodied by the above-mentioned cleaning and drying system for semiconductor wafers, the same apparatus may be employed as an independent apparatus.

Finally, it will be understood by those skilled in the art that the foregoing descriptions are nothing but embodiments of the disclosed cleaning and drying apparatus and method and therefore, various changes and modifications may be made within the scope of claims.

The invention claimed is:

1. A cleaning and drying apparatus for a substrate holder chuck including a holding member having a plurality of holding grooves formed in a row to hold a plurality of substrates, the plurality of holding grooves being formed on an upper face of the holding member, the cleaning and drying apparatus comprising:
    an atomize nozzle including a nozzle hole facing the upper face of the holding member for spraying a cleaning liquid and gas to the upper face of the holding member;
    a cleaning-liquid nozzle including a nozzle hole facing a side face of the holding member for spraying a cleaning liquid to the side face of the holding member; and
    a moving mechanism for moving the holding member in relation to the atomize nozzle and the cleaning-liquid nozzle in a direction along the longitudinal direction of the holding member,
    wherein the atomize nozzle and the cleaning liquid nozzle are provided at different positions along the longitudinal direction of the holding member and thus face two different regions of the holding member when the holding member is in proximity of said nozzles, the two different regions being displaced from each other at least along the longitudinal direction of the holding member so that the atomize nozzle initially sprays the cleaning liquid and the gas to the upper face of respective parts of the holding member and the cleaning-liquid nozzle subsequently sprays the cleaning liquid to the side face of said parts of the holding member as the moving mechanism moves the holding member with respect to the atomize nozzle and the cleaning liquid nozzle along the longitudinal direction from the atomize nozzle to the cleaning liquid nozzle.

2. The cleaning and drying apparatus for the substrate holder chuck as claimed in claim 1, further comprising:
- a positive-pressure chamber formed on at least one side of the atomize nozzle in its moving direction for cleaning the holding member, the positive-pressure chamber allowing the holding member to be inserted thereinto;
- a gas spray nozzle for spraying a gas into the positive-pressure chamber;
- a switching equipment interposed in a pipeline connecting the gas spray nozzle with a gas source; and
- a controller for controlling a switching action of the switching means, wherein
- when the atomize nozzle sprays the cleaning liquid and the gas into the holding grooves of the holding member, the gas from the gas spray nozzle is sprayed into the positive-pressure chamber by the switching equipment, thereby establishing the positive-pressure chamber under a positive pressure.

3. A cleaning and drying apparatus for a substrate holder chuck including a holding member having a plurality of holding grooves formed in a row to hold a plurality of substrates, the plurality of holding grooves being formed on an upper face of the holding member, the cleaning and drying apparatus comprising:
- an atomize nozzle including a nozzle hole facing the upper face of the holding member for spraying a cleaning liquid and gas to the upper face of the holding member;
- a switching equipment for switching from a supply of the cleaning liquid to a supply of the gas and vice versa, selectively;
- a dry-gas nozzle including a first nozzle hole facing an upper face of the holding member and a second nozzle hole facing a side face of the holding member for spraying a dry gas to the upper face and the side face of the holding member;
- a moving mechanism for moving the holding member in relation to the atomize nozzle and the dry-gas nozzle in a direction along the longitudinal direction of the holding member; and
- a controller for controlling the switching operation of the switching equipment and the movement of the moving mechanism,
- wherein the atomize nozzle and the dry gas nozzle are provided at different positions along the longitudinal direction of the holding member and thus face two different regions of the holding member when the holding member is in proximity of said nozzles, the two different regions being displaced from each other at least along the longitudinal direction of the holding member so that the atomize nozzle initially sprays the cleaning liquid and the gas to the upper face of respective parts of the holding member, the atomize nozzle then sprays only the gas to the upper face of said parts of the holding member by using the switching equipment, and subsequently the dry-gas nozzle sprays the dry gas to the upper face and the side face of said parts of the holding member as the moving mechanism moves the holding member in relation to the atomize nozzle and the dry gas nozzle along the longitudinal direction from the atomize nozzle to the dry gas nozzle.

4. The cleaning and drying apparatus for the substrate holder chuck as claimed in claim 3, further comprising a cleaning-liquid nozzle for spraying a cleaning liquid to the side faces of the holding member, the cleaning-liquid nozzle being movable by the moving mechanism
- wherein, after the atomize nozzle sprays the cleaning liquid and the gas, after the cleaning-liquid nozzle sprays the cleaning liquid to the side face of holding member to execute cleaning, the atomize nozzle sprays only the gas to the holding grooves of the holding member by operating the switching equipment, the dry-gas nozzle spraying the dry gas to the holding grooves of the holding member and the side face thereof to execute drying by operation of the moving mechanism.

5. The cleaning and drying apparatus for the substrate holder chuck as claimed in claim 3, further comprising:
- a cleaning-liquid nozzle for spraying a cleaning liquid to the side faces of the holding member; and
- a secondary dry-gas nozzle for spraying the dry gas to the holding grooves, lower parts of the side faces and a base end of the holding member,
- wherein the cleaning-liquid nozzle and the secondary dry-gas nozzle are movable by the moving mechanism,
- after the atomize nozzle sprays the cleaning liquid and the gas to the holding grooves of the holding member, after the cleaning-liquid nozzle sprays the cleaning liquid to the side face of the holding member to execute cleaning, the atomize nozzle sprays the gas only to the holding grooves of the holding member by operating the switching equipment, the dry-gas nozzle to spray the dry gas to the holding grooves and the side faces of the holding member, the secondary dry-gas nozzle spraying the dry gas to the holding grooves and the lower parts of the side faces and the base end of the holding member to execute drying, by operation of the moving mechanism.

6. The cleaning and drying apparatus for the substrate holder chuck as claimed in claim 5, wherein there are arranged, in order from a tip side of the holding member toward a base side thereof in a direction of an outward movement of the moving mechanism, the secondary dry-gas nozzle, the dry-gas nozzle, the atomize nozzle and the cleaning-liquid nozzle.

7. The cleaning and drying apparatus for the substrate holder chuck as claimed in claim 5, further comprising:
- a positive-pressure chamber formed so as to surround the secondary dry-gas nozzle, the positive-pressure chamber allowing the holding member to be inserted thereinto;
- a switching equipment interposed in a pipeline connecting the secondary dry-gas nozzle with a dry-gas source; and
- a controller for controlling a switching action of the switching equipment, wherein
- when the atomize nozzle sprays the cleaning liquid and the gas into the holding grooves of the holding member, the dry gas from the secondary dry-gas nozzle is sprayed into the positive-pressure chamber by the switching equipment, thereby establishing the positive-pressure chamber under a positive pressure.

8. The cleaning and drying apparatus for the substrate holder chuck as claimed in claim 3, further comprising a switching equipment and a pressure regulator both of which are interposed in a gas pipeline connecting the atomize nozzle with a gas source, wherein
- the controller is capable of controlling a pressure regulating operation of the pressure regulator, the gas of a low pressure controlled by the pressure regulator is supplied by the switching equipment when supplying the cleaning liquid and the gas through the atomize nozzle, and the gas of a high pressure controlled by the pressure regulator is supplied by the switching equipment when supplying only the gas through the atomize nozzle.

9. The cleaning and drying apparatus for the substrate holder chuck as claimed in claim 1 or 3, further comprising:
- a fresh-air suction passage which is formed outside the atomize nozzle, and
- a gas guide passage which is formed in succession to the fresh-air suction passages to guide the gas along outside faces of the holding member.

10. The cleaning and drying apparatus for the substrate holder chuck as claimed in claim 1 or 3, wherein the atomize nozzle is inclined to a direction that the holding grooves of the holding member extend.

11. The cleaning and drying apparatus for the substrate holder chuck as claimed in claim 1 or 3, wherein
- the holding member is provided, on a side part thereof, with a plurality of side holding grooves for engagement with respective side parts of the substrates, and
- the atomize nozzle is arranged so as to oppose the side holding grooves thereby spraying the cleaning liquid and the gas to the side holding grooves of the holding member.

* * * * *